United States Patent [19]
Kojima et al.

[11] Patent Number: 6,027,843
[45] Date of Patent: Feb. 22, 2000

[54] CHARGED-PARTICLE-BEAM MICROLITHOGRAPHY METHODS INCLUDING CORRECTION OF IMAGING FAULTS

[75] Inventors: Shinichi Kojima, Wappingers Falls, N.Y.; Teruaki Okino, Kamakura, Japan

[73] Assignee: Nikon Corporation, Tokyo, Japan

[21] Appl. No.: 09/325,103

[22] Filed: Jun. 3, 1999

[30] Foreign Application Priority Data

Jun. 3, 1998 [JP] Japan .................................. 10-169139

[51] Int. Cl.⁷ ...................................................... G03F 9/00
[52] U.S. Cl. ............................................. 430/30; 430/296
[58] Field of Search ...................................... 430/30, 296

[56] References Cited

U.S. PATENT DOCUMENTS

| | | | |
|---|---|---|---|
| 5,437,948 | 8/1995 | Minghetti et al. | 430/30 |
| 5,770,337 | 6/1998 | Chiang | 430/30 |
| 5,795,687 | 8/1998 | Yasuda | 430/30 |

*Primary Examiner*—Christopher G. Young
*Attorney, Agent, or Firm*—Klarquist Sparkman Campbell Leigh & Whinston, LLP

[57] ABSTRACT

Charged-particle-beam (CPB) exposure methods are disclosed that resolve the problem of aberrations produced by an image-adjustment lens and the problem of limitations in the speeds in which stage-correction mechanisms can be adjusted. Adjustments of stage-correction mechanisms and image-adjustment lenses are optimized in any of various combinations depending upon exposure conditions, pattern configuration, etc. Image rotation and defocusing in CPB microlithography can be corrected by moving the reticle stage and substrate stage using respective stage-control and correction devices. Alternatively or in addition, adjustments can be made by controllably adjusting a deflector and/or an image-adjustment lens. Whenever corrections are required over a wide correction range and a relatively slow correction speed is acceptable, corrections can be made using a stage-correction mechanism. Other corrections can be made as required using the image-adjustment lens which offers substantially greater speed but a narrower correction range.

33 Claims, 3 Drawing Sheets

CHARGED-PARTICLE-BEAM MICROLITHOGRAPHY METHODS INCLUDING CORRECTION OF IMAGING FAULTS

FIELD OF THE INVENTION

This invention pertains to microlithographic projection-exposure methods in which a charged particle beam is employed for making an exposure of a reticle pattern onto a sensitive substrate, as would be employed in the manufacture of semiconductor devices, displays, and the like. More specifically, the invention pertains to methods for making certain corrections of imaging faults in such apparatus, such as image rotation, lateral displacement, and defocusing.

BACKGROUND OF THE INVENTION

In conventional charged-particle-beam (CPB) projection-exposure methods and apparatus, such as methods and apparatus employing an electron beam for transferring a pattern defined on a reticle onto a sensitive substrate, specific techniques are employed for correcting certain imaging errors such as image rotation and suboptimal focus.

A typical technique is illustrated in FIG. 5, depicting an adjustment of the focal position of an image being projected onto a sensitive substrate. Specifically, an electron beam 1, carrying an image of a pattern defined on an upstream reticle (not shown), is refracted by a lens 30 so as to produce an image on a surface of a sensitive substrate 6 such as a semiconductor wafer. The lens 30 can be an electromagnetic lens or an electrostatic lens. Whenever the electron beam 1 does not converge to form a focused image on the substrate 6 (a condition indicated by the dotted line), the focal position of the electron beam 1 is axially changed by adjusting the lens 30. Such an adjustment is performed until a properly focused image is formed on the surface of the substrate 6 (as indicated by the solid line).

In an electron-optical system, when performing image adjustment using an electromagnetic lens 30, it is possible to change the focal position and rotation of an image by changing the electrical current flowing through the lens coil of the lens. Such a change in current causes a corresponding change in the lensing action of the electromagnetic lens, which causes a corresponding change in the imaging position.

Certain conventional CPB optical systems also employ, in association with primary electromagnetic and/or electrostatic lenses, auxiliary lenses that generate a relatively weak magnetic or electrical field (compared to the associated primary lenses). The energization of such auxiliary lenses is variable so as to achieve an adjustment of the corresponding primary lens as required.

Further with respect to conventional CPB projection-exposure apparatus, the position of the image can be shifted in a direction parallel to the surface of the substrate by subjecting the charged particle beam to a magnetic or electrical field extending in a direction perpendicular to the field of the corresponding primary lens. Such action is termed "deflection," and an appliance that performs deflection is termed a "deflector." Unfortunately, whenever a charged particle beam is deflected, accompanying deflection aberrations are typically generated. Deflection aberrations are manifest as one or more of, for example, focal shift, rotation, magnification change, astigmatism, and astigmatism distortion, etc., in the image as formed on the substrate. Such aberrations are undesirable because they degrade the resolution and distort the shape of the image. To correct or at least reduce such aberrations, deflection-aberration-correction lenses are typically utilized, thereby further adding to the complexity of the CPB optical system.

In microlithographic projection-exposure apparatus that employ light for forming the image of the reticle pattern on the substrate surface, corrections of rotation and focal position of the image are generally performed using a correction mechanism that interacts with the substrate stage. I.e., the desired exposure location on the substrate is aligned with the reticle image by changing the angular orientation of the substrate about the optical axis of the apparatus and/or by changing the "height" of the substrate (i.e., position of the substrate along the optical axis). Such changes are typically performed using a stage-rotation-adjustment mechanism and a stage-height-adjustment mechanism, respectively.

Stage shifting is illustrated in FIG. 6. Ideally, the electron beam 1 forms an image on the substrate 6 (solid line) for best image focus. However, if the substrate is at a position indicated by the dashed line, proper focus of the image on the sensitive substrate 6 can be achieved by moving the substrate stage (holding the sensitive substrate 6) downward as indicated by the arrow. The advantage of such stage-shifting is that residual deflection aberrations (otherwise generated when rotation correction and focus correction are made using a corrective deflector or the like) are not produced.

During exposure performed using certain types of conventional CPB projection-exposure apparatus, the reticle is moved by a reticle stage in synchrony with motion of the substrate. With such apparatus, it is necessary not only to correct rotation and "height" errors of the substrate, but also to correct rotation and height errors of the reticle. Such corrections are typically made by concerted actions of an image-correction lens, a reticle-stage-correction mechanism, and a substrate-stage-correction mechanism.

Since a stage has a relatively large mass, its resonance frequency is low. Consequently, movement imparted to a stage for the purpose of making a correction as noted above is limited, i.e., rotation, lateral displacement, and height corrections of the stage only can be made at a maximum frequency of several hundred Hz. In order to achieve high throughput, the projection-exposure apparatus must be able to perform exposures of reticle subfields at a rate of several KHz or higher. If corrections are needed from subfield to subfield, mechanical stage corrections simply cannot be made sufficiently rapidly to ensure proper correction from subfield to subfield and still achieve satisfactory throughput.

Whereas imaging corrections can be made more rapidly using an image-correcting lens, such corrections are limited to a narrow range of beam deflection. This is because large changes to the beam imparted by an image-correction lens introduce substantial aberrations that can be difficult to correct. In other words, an image-correcting lens can introduce image defocusing and distortion as the lens is being used to correct other imaging problems. Therefore, the range of operation of an image-correcting lens is typically very narrow.

In view of the foregoing, there is a need for improved methods and apparatus for performing imaging correction in CPB projection-exposure apparatus.

SUMMARY OF THE INVENTION

The present invention provides, inter alia, charged-particle-beam (CPB) microlithographic exposure apparatus that solve the problem of aberrations generated by an image-correction lens. The present invention also solves the problem of limitations on the speed of the stage-correction mechanism by using an optimal combination of correction methods using a stage-correction device and an image-correction lens.

As used herein, a "stage-correction device" refers to either or both of a mechanism for correctively adjusting the position of a reticle stage and a mechanism for correctively adjusting the position of a substrate stage. Stage correction can include an adjustment of the stage along either axis of the transverse plane, an adjustment of the angular orientation of the stage about the optical axis, a tilt adjustment, and/or a height adjustment.

As used herein, correction using an "image-correction lens" can include use of a deflector as required.

According to one aspect of the invention, methods are provided for imprinting an image of a pattern, defined by a reticle mounted on a reticle stage, onto a substrate mounted on a substrate stage. The imprinting of the image is performed using a charged particle beam passing through the reticle, through a projection lens, and through an image-adjustment lens to the substrate. The methods include a method for correcting an imaging fault. According to a representative embodiment of an imaging-fault-correction method, the pattern image is projected onto the substrate. A positioning error of a stage (reticle stage and/or substrate stage) is detected relative to a nominal "ideal" position required for optimal imaging. (A stage-positioning error can be detected using respective interferometers and "height" sensors (i.e., sensors of axial placement). From the detected stage-positioning error, a correction to the imaging fault is determined. If the determined correction requires an adjustment displacement having a magnitude at or above a preset threshold, then the imaging fault is corrected by moving a stage. If the determined correction requires an adjustment displacement having a magnitude below the preset threshold and requiring an adjustment speed that does not reduce throughput from a level that would otherwise be achieved if no imaging fault were detected, then the imaging fault is corrected by adjusting the image-adjustment lens. The imaging fault can be one or more of, for example, an image-rotation error, an image lateral-displacement error, and an image-defocusing error of the pattern image as formed on the substrate.

Generally, the substrate has a size sufficient for being exposed with multiple separate chip fields. In any event, a number of different combinations of adjustments are within the scope of the invention.

For example, the correction can include an adjustment of at least one of the substrate and a chip field. In such an instance, adjustments of the substrate and of the chip field can be performed as required by moving a stage. In addition, if the reticle pattern is divided on the reticle into multiple stripe fields, then the correction can include an adjustment of at least one of the substrate, the chip field, and a stripe field. Adjustments of the stripe field can be performed as required by moving a stage or by adjusting the image-adjustment lens.

As another example, the reticle pattern can be divided on the reticle into multiple stripe fields each divided into multiple subfields for individual exposure onto a chip field on the substrate. In such an instance, adjustments of the substrate and of the chip field can be performed as required by moving a stage. If the determined correction further includes an adjustment of at least one of image rotation and image focus, then the adjustments of the image rotation and image focus can be performed, as required, independently of adjustments of the substrate and chip field. The adjustments of the image rotation and image focus can performed as required by moving a stage, with any residual correction of at least one of the substrate, the chip field, image rotation, and image focus being performed as required by adjusting the image-adjustment lens. If any corrections to the reticle are required, adjustments of the reticle can be performed by moving a stage (e.g., reticle stage and/or substrate stage). Alternatively, adjustments of the image rotation and image focus can be performed as required by adjusting the image-adjustment lens, with any residual correction of one or more of the substrate, the chip field, image rotation, and image focus being performed as required by adjusting the image-adjustment lens.

As another example, the reticle pattern can be divided on the reticle into multiple stripe fields each divided into multiple subfields for individual exposure onto a chip field on the substrate. In such an instance, adjustments of the substrate, the chip field, and the stripe field can be performed as required by moving a stage. If an adjustment of a subfield is required, then such adjustments can be performed as required by adjusting the image-adjustment lens.

As yet another example, the reticle pattern can be divided on the reticle into multiple stripe fields each divided into multiple subfields for individual exposure onto a chip field on the substrate. In such an instance, adjustments of the substrate and the chip field can be performed as required by moving a stage, and adjustments of the stripe field can be performed as required by adjusting the image-adjustment lens. If the correction includes an adjustment of a subfield, then such adjustments of the subfield can be performed as required by adjusting the image-adjustment lens.

As yet another example, the reticle pattern can be divided on the reticle into multiple subfields for individual exposure onto a chip field on the substrate. In such an instance, the adjustments of the substrate can be performed as required by moving a stage. If the correction includes an adjustment of the chip field, then such adjustments of the chip field can be performed as required by moving a stage. If the correction includes an adjustment of a subfield, then such adjustments of the subfield can be performed as required by adjusting the image-adjustment lens.

As yet another example, the reticle pattern can be divided on the reticle into multiple stripe fields each divided into multiple slot fields for individual exposure onto a chip field on the substrate. In such an instance, the correction can include an adjustment of one or more of the substrate, the chip fields, the stripe fields, and the slot fields. The adjustments of one or more of the substrate, the chip fields, the stripe fields, and the slot fields can be performed as required by moving a stage. Alternatively, adjustments of one or more of the substrate, the chip fields, the stripe fields, and the slot fields can be performed as required by adjusting the image-adjustment lens. Further alternatively, adjustments of one or more of the substrate, the chip fields, and the stripe fields can be performed as required by moving a stage, with adjustments of the slot fields being performed as required by adjusting the image-adjustment lens. Yet further alternatively, adjustments of one or more of the substrate and the chip fields can be performed as required by moving a stage, with adjustments of one or more of the stripe fields and the slot fields being performed as required by adjusting the image-adjustment lens.

As yet another example, the reticle pattern can be divided on the reticle into multiple slot fields for individual exposure onto a chip field on the substrate. In such an instance, the correction can include an adjustment of one or more of the substrate, the chip fields, and the slot fields. Such adjustments can be performed as required by moving a stage. Alternatively, adjustments of one or more of the substrate and the chip fields can be performed as required by moving a stage, with the adjustments of the slot fields being made as required by adjusting the image-adjustment lens.

As yet another example, the correction can include an adjustment of one or more of rotation of the reticle stage, height of the reticle stage, rotation of the substrate stage, and height of the substrate stage. In such an instance, adjustments of rotation of the reticle stage and/or height of the reticle stage can be performed as required by moving the reticle stage. Also, adjustments of at least one of rotation of the substrate stage and height of the substrate stage can be performed as required by moving the substrate stage. Alternatively, where the correction includes an adjustment of at least one of rotation of the reticle stage and height of the reticle stage, such adjustments can be performed as required by moving the substrate stage.

It is noted that a stage-adjustment mechanism and the image-adjustment lens can be calibrated by detecting an imaging fault of the projected pattern image. From a detected error in stage position, a correction to the imaging fault can be determined and executed according to, e.g., any of the examples summarized above.

The foregoing and other features and advantages of the invention will be more readily apparent from the following detailed description, which proceeds with reference to the accompanying drawings.

DETAILED DESCRIPTION

The invention is described below in the context of multiple example embodiments.

Figure 1:
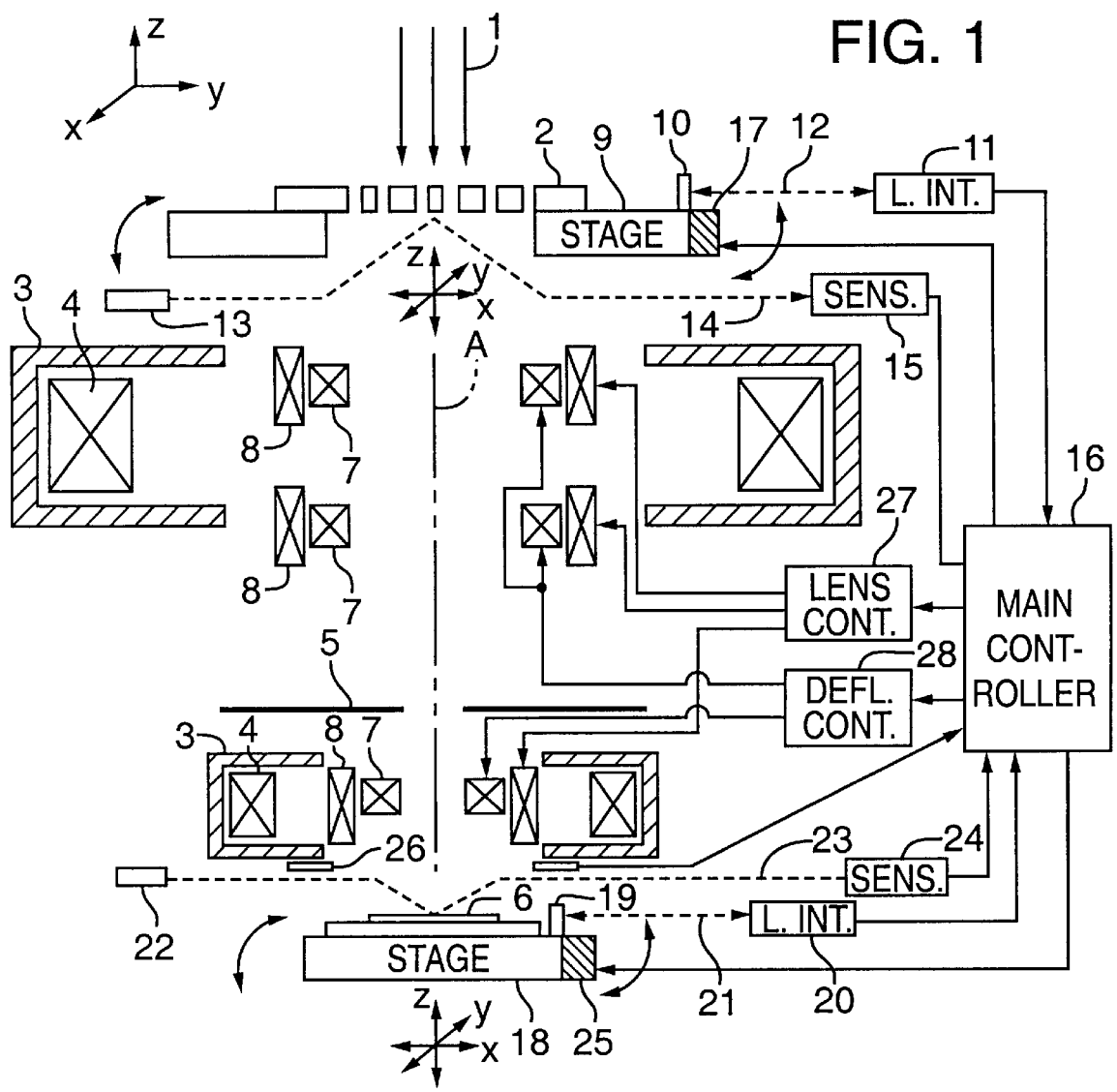
FIG. 1 schematically depicts a representative embodiment of a charged-particle-beam (CPB) projection-exposure apparatus according to the invention.

A representative charged-particle-beam (CPB) projection-exposure apparatus (that specifically employs an electron beam as a representative charged particle beam) according to the invention is depicted in FIG. 1.

The FIG. 1 apparatus generates an electron beam 1 from an electron-beam source (not shown) located upstream of the components depicted in FIG. 1. The electron beam is directed by an upstream illumination-optical system to a reticle 2 (the illumination-optical system is not shown but is understood to be situated between the electron-beam source and the reticle 2). The FIG. 1 apparatus then directs the electron beam passing through the reticle 2 to the surface of a suitable sensitive substrate 6 so as to imprint an image of the illuminated region of the reticle onto the sensitive substrate.

Specifically, the FIG. 1 apparatus comprises a main lens pole 3, a main lens coil 4 situated inside the main lens pole 3, a scattering aperture 5 located downstream of the main lens pole 3, a deflection coil 7 and an image-adjustment lens 8 located between the main lens pole 3 and the scattering aperture 5, a reticle stage 9 on which the reticle 2 is mounted, a reflective mirror 10 situated along an edge of the reticle stage 9, a reticle-stage laser interferometer 11 that directs a laser beam 12 to the mirror 10 for detection by the laser interferometer 11 of the position of the reticle stage 9, a laser light source 13 that produces a laser light beam 14 that reflects from the surface of the reticle 2 to a sensor 15 for determining reticle "height" (displacement along the optical axis A), a main controller 16 to which the interferometer 11 and sensor 15 are connected, a reticle-stage driver 17 connected to the main controller 16, a substrate stage 18, a reflective mirror 19 situated along an edge of the substrate stage 18, a substrate-stage laser interferometer 20 connected to the main controller 16 and that directs a laser light beam 21 to the mirror 19 for detection by the laser interferometer 20 of the position of the substrate stage 18, a laser light source 22 that produces a laser light beam 23 that reflects from the surface of the substrate 6 to a sensor 24 connected to the main controller 16, a substrate-stage driver 25 connected to the main controller 16, a backscattered-electron detector 26 connected to the main controller 16, a lens controller 27 connected to the main controller 16, and a deflector controller 28 connected to the main controller 16.

The electron beam 1 (propagating from the upstream illumination optical system) irradiates the reticle 2. The reticle 2 defines a reticle pattern to be "transferred" to (i.e., projection-exposed onto) the surface of the substrate 6. Electrons of the beam passing through the reticle 2 are subjected to lens action by the main lens pole 3. After passing through the scattering aperture 5, such electrons form an image of the reticle pattern on the substrate 6. The deflection coil 7 deflects the electron beam sufficiently to cause the electron beam to expose an area on the substrate 6 that corresponds to the particular illuminated region on the reticle 2. The image-adjustment lens 8 desirably comprises at least three independently adjustable lens components (see FIG. 1). Such an assemblage of lens components allows independent adjustment of, e.g., one or more of rotation, "focus," and "magnification." Thus, the image-adjustment lens 8 can correct independently the position of the resulting image along the optical axis A and rotation of the image as projected onto the substrate 6. Similarly, the deflector 7 desirably comprises at least three independently adjustable deflector components (see FIG. 1). FIG. 1 also shows that each lens component 8 desirably has an associated deflector component 7.

The reticle 2 is mounted on the reticle stage 9. The reflective mirror 10 and the reticle-stage interferometer 11 are used to detect the position of the reticle stage 9 by directing the laser beam 12 onto the reflective mirror 10 and then receiving the reflected light. Although only one reticle-stage interferometer 11 is shown in the figure, it will be understood that the reticle stage 2 is provided with at least one interferometer in the x direction and at least one interferometer in the y direction. In at least one of the x and y directions, a second interferometer is also provided to detect, in concert with the first interferometer in that direction, rotation of the reticle stage 9 about the axis A. To such end, the first and second interferometers in the same direction are parallel to each other but laterally displaced from each other so as to perform simultaneous measurements at two locations along the respective mirror.

The position of the reticle 2 in the height direction (i.e., along the axis A) is measured by directing the laser beam 14 from the laser source 13 onto the reticle 2 and receiving the reflected light using the sensor 15. Reticle-position data obtained by the various devices described above for measuring reticle position are input to the main controller 16.

The reticle stage 9 is driven by the reticle-stage driver 17. Whereas only one reticle-stage driver 17 is shown in the figure, desirably at least four reticle-stage drivers are actually used to move the reticle stage 9 along the x direction, along the y direction, and along the z direction, as well as rotate the reticle stage, respectively. The reticle-stage drivers 17 are actuated by respective control signals from the main controller 16.

The substrate 6 is mounted on the substrate stage 18. The reflective mirror 19 and the substrate-stage interferometer 20 are used to detect the position of the substrate stage 18 by directing the laser beam 21 onto the reflective mirror 19 and then receiving the reflected light. Although only one substrate-stage interferometer 20 is shown in the figure, it will be understood that the substrate stage 18 is provided with at least one interferometer in the x direction and at least one interferometer in the y direction. In at least one of the x and y directions, a second interferometer is also provided to detect, in concert with the first interferometer in that direction, rotation of the substrate stage 9 about the axis A. To such end, the first and second interferometers in the same direction are parallel to each other but laterally displaced from each other so as to perform simultaneous measurements at two locations along the respective mirror.

The position of the substrate 6 in the height direction (i.e., along the axis A) is measured by directing the laser beam 23 from the laser source 22 onto the substrate 6 and receiving the reflected light using the sensor 24. Substrate-position data obtained by the various devices described above for measuring substrate position are input to the main controller 16.

The substrate stage 18 is driven by the substrate-stage driver 25. Whereas only one substrate-stage driver 25 is shown in the figure, desirably at least four substrate-stage drivers are actually used to move the substrate stage 18 along the x direction, along the y direction, and along the z direction, as well as rotate the substrate stage, respectively. The substrate-stage drivers 25 are actuated by respective control signals from the main controller 16.

The backscattered-electron detector 26 detects electrons backscattered from a chip-position detection mark (alignment-measurement mark) inside each chip as formed on the substrate 6. Thus, the backscattered-electron detector 26 detects the position of each chip on the substrate and outputs data concerning such positions to the main controller 16.

The lens controller 27 actuates the lens components of the image-adjustment lens 8, and the deflector controller 28 actuates the deflector components of the deflection coil 7 as required to change the position of the reticle image in the height (z) direction, to rotate the image, and to laterally shift the position of the image along the x and y directions. Outputs from the lens controller 27 and deflector controller 28 are routed to the respective lens components of the image-adjustment lens 8 and deflector components of the deflection coil 7. The lens controller 27 and the deflector controller 28 receive respective control signals from the main controller 16.

With respect to the FIG. 1 embodiment, correction of lateral (i.e., x-y or "horizontal") displacement, rotation, and defocusing of the image position can be effected by one or more of the following options:

(1) changing the horizontal, vertical, or rotational position of the reticle stage 9, (2) changing the horizontal, vertical, or rotational position of the substrate stage 18, and (3) driving the components of the deflector 7 and/or the components of the image-adjustment lens 8 using the lens controller 27 and the deflector controller 28, respectively.

Each of options (1) and (2), as explained above, has a wide correction range but exhibits a relatively slow response. Options (1) and (2) also do not generate any new aberrations, and can be performed with high accuracy. Option (3) has a narrow correction range but exhibits a relatively fast response. Hence, option (3) can be utilized whenever corrections must be made at a rate exceeding the rate at which either of options (1) and (2) can be performed. Although option (3) can introduce aberrations, the relatively narrow correction range of option (3) minimizes the generation of new aberrations. According to the present invention, image correction is achieved by selectively exploiting the attributes of these options and by combining the options as required to achieve maximal correction with minimal adverse effect on throughput and without increasing aberrations.

Figure 2:
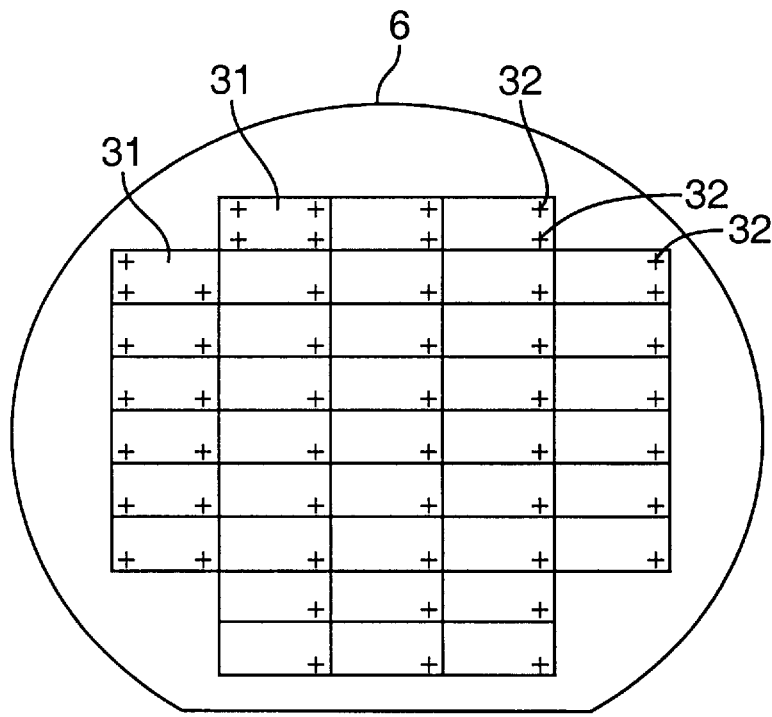
FIG. 2 is a plan view of an array of chip dies on the surface of a semiconductor substrate.

FIG. 2 shows an array of chip dies on the surface of a sensitive substrate (e.g., semiconductor wafer) 6. Each chip die is represented as a "chip field" 31. As noted above, each chip field 31 includes an alignment-measurement mark 32.

Figure 3:
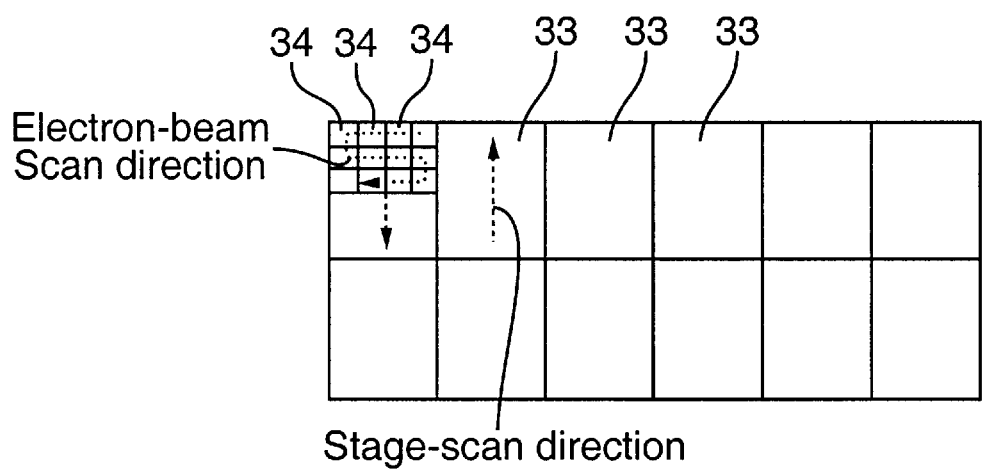
FIG. 3 is a plan view of a first exemplary arrangement of multiple fields within a chip die.

A first representative arrangement of fields within a chip field 31 is shown in FIG. 3. Specifically, FIG. 3 depicts a portion of a chip field divided into multiple "stripes" 33. Each stripe 33 is subdivided into multiple "subfields" 34. During exposure of the chip field 31, the electron beam 1 (FIG. 1) is scanningly deflected by a deflector (located upstream of the reticle 2) to expose each subfield 34 of each stripe 33 in a sequential manner. Meanwhile, the reticle 2 and substrate 6 are scanningly moved along the length dimension of each stripe 33. When exposure of one stripe 33 is completed, the reticle 2 and substrate 6 are displaced in a direction perpendicular to the length dimension of the stripe 33 to place the next stripe in position for exposure. The projected images of the subfields 34 in each stripe 33, and of each stripe 33, are carefully positioned on the substrate so as to "stitch" all the projected images together in the correct order to transfer each chip die onto the substrate 6.

Corrections of horizontal displacement, axial displacement (defocusing), and rotational displacement of an image of a pattern subdivided as in FIG. 3 can be categorized as follows:

(a) correction made as required each time a new substrate 6 is positioned for exposure, (b) correction made as required each time a new chip field 31 (on the same substrate) is positioned for exposure, (c) correction made as required each time a new stripe 33 (in the same chip field) is positioned for exposure, (d) correction made as required each time a new subfield 34 (in the same stripe or chip field) is positioned for exposure, and (e) other corrections as required, such as correction of height displacements and the like resulting from spontaneous flatness errors in the substrate 6 and reticle 2, made in real time during exposure.

Corrections (a) made from one substrate 6 to the next typically include corrections of rotational errors and substrate-thickness variations. On the same substrate 6, rotational errors and axial-displacement errors can also arise from chip field 31 to chip field (correction (b)); therefore, detection and correction of such errors are desirably performed from one chip field 31 to the next. These types of corrections can be performed by detecting the "height" (i.e., position along the optical axis A) of the substrate 6 using the sensor 24, and then correcting any detected errors. Corrections at the stripe or subfield level (corrections (c) or (d), respectively) can be made from data concerning the position of the reticle and data concerning the projection-optical system used to project the reticle pattern onto the substrate. The data are used in calculations (performed by the main controller 16) establishing a relationship between magnitude of required correction and magnitude of deflection.

Since stripe-rotation and height errors can arise in each stripe 33 within a chip field 31, corrections (c) desirably are made for each stripe 33. Corrections of rotation and height also may be needed for certain subfields 34 within a stripe 33 (correction (d)), as well as correction of aberrations arising from beam deflections.

The magnitude of correction, if required, is normally greatest for a correction involving the entire substrate (correction (a)); progressively smaller magnitudes of correction, if required, attend corrections involving a chip (correction (b)), a stripe (correction (c)), and a subfield (correction (d)). In contrast, the required rapidity of response, if required, would be greatest for a correction involving a subfield (correction (d)), with progressively slower responses being acceptable for corrections involving a stripe (correction (c)), a chip (correction (b)), and the entire substrate (correction (a)), respectively. Consequently, whenever the magnitude of required correction is great but the response speed can be relatively slow, corrections involving the entire substrate and/or a chip (corrections (a) and (b)) can be performed using, for example, a stage-correction device. Such a correction scheme selectively exploits the advantages of correction performed using a stage-correction device (wide correction range and minimal generation of new aberrations) while avoiding the disadvantages of performing the corrections in another manner.

According to a first example embodiment, corrections (a), (b), and (c) (i.e., corrections for each substrate 6, for each chip field 31, and for each stripe 33, respectively) are performed by detecting and manipulating stage position as required. This is because, inter alia, correction (a) requires a wide displaceability range but not speed; correction (b) does not require speed because the corrections can be made while the substrate stage 18 is being moved from one chip field 31 to the next; and correction (c) does not require speed because the corrections can be made while the substrate 6 is being shifted from one stripe to the next. Correction (d), in contrast, typically requires a fast correction speed, but the displaceability range is very limited. Hence, corrections (d) are performed in this example embodiment using the image-adjustment lens 8 (and deflector 7 as required). This example embodiment can also be applied to situations in which the amount of correction that may be required at the stripe level is relatively great.

A second exemplary embodiment is used whenever the detected rotation and height errors for stripes 33 are small. In such an instance, corrections (a) and (b) can be performed by manipulating a stage, and corrections (c) and (d) can be performed using the image-adjustment lens 8 (and deflector 7 as required). Hence, this example embodiment selectively exploits the advantages of correction option (3) (notably rapid speed despite a narrow displaceability range) where such corrections can be applied most efficiently with minimal adverse impact on aberrations and throughput.

A third exemplary embodiment is especially suitable for use whenever the chip pattern is divided directly into subfields 34 without also being divided into stripes 33. In such an instance, required corrections at the substrate level (corrections (a)) and the chip level (corrections (b)) can be relatively large, but the characteristically slower response speed at these levels can be tolerated. Hence, corrections (a) and (b) are performed by detecting and correcting stage position. Correction (c) is not performed, and correction (d) is performed using the image-adjustment lens 8 (and the deflector 7 as required).

As noted above, the displaceability range in which image rotation and defocusing can be corrected using the image-adjustment lens 8 is relatively narrow compared to the range in which corrections using a stage-correction device can be made. However, corrections made using the image-adjustment lens 8 can be performed much more rapidly than with a stage-correction device. Corrections at the subfield level (corrections (d)) typically demand a fast response time but any correction displacements that are made are typically small in magnitude. Hence, this example embodiment selectively exploits the advantages of each of options (1)–(3) listed above.

According to a fourth exemplary embodiment, corrections (a) and (b) are performed by detecting and correcting stage position, and correction (e) is performed in real time by detecting and correcting stage position during exposure. Such a scheme is especially suitable for situations in which the respective periods of height displacements arising from flatness deviations of the substrate 6 and the reticle 2 are significant and correctable by changing stage position. In this embodiment, corrections (c) and (d) are optional; if performed, correction (d) is performed using the image-adjustment lens 8 (and the deflector 7 as required).

Correction of image rotation and defocusing generated by flatness deviations of the substrate and/or reticle must be implemented in real time during projection exposure. Such real-time correction is desirably performed by the stage-correction device because the magnitude of correction can be substantial but the period of corrections is typically relatively long.

According to a fifth exemplary embodiment, "coarse" corrections (a) and (b) are performed by detecting and correcting stage position. Also, other corrections are performed as required primarily using the stage-correction device and can be performed independently and at different times from corrections (a) and (b). I.e., real-time correction of reticle and/or substrate displacement (correction (e)), as well as "coarse" corrections (c) and (d) are performed using the stage-correction device. The image-adjustment lens 8 is used to correct any residual errors that are not eliminated by the real-time correction. In addition, since the response rate of the stage-correction device is relatively low, as discussed above, any required residual corrections (typically small in magnitude) that could not be eliminated using the stage-correction device can be made using the image-adjustment lens 8 (and deflector 7 as required) which has the requisite rapid response rate for making residual corrections. This scheme is especially suitable for situations in which height displacements and the like arising from flatness deviations in the substrate 6 and the reticle 2 are large but have a relatively short period. Also, whereas large ("coarse") errors are reduced by manipulating the stage(s), small residual errors are eliminated using the image-adjustment lens 8 as a fine adjustment. In this embodiment, corrections (c) and (d) may be performed (generally using the image-adjustment lens 8 and deflector 7 as required) independently of the real-time corrections; alternatively, corrections (c) and (d) can be performed along with the real-time corrections.

A sixth example embodiment is similar to the fifth example embodiment but includes performing corrections for each reticle 2 by manipulating the reticle and/or substrate stages (i.e., by using a stage-correction device). In this embodiment, "coarse" corrections are made using the stage-correction device, and any residual correction (of errors not eliminated by manipulating the stage-correction device) are made using the image-adjustment lens 8 (and deflector 7 as required) as a fine adjustment. Thus, corrections at the substrate level, reticle level, and chip level can be respectively performed whenever the substrate is replaced, the reticle replaced, and when a new chip is positioned for exposure, respectively. Corrections of image rotation and focus can be performed using the stage-correction device independently of the former corrections.

According to a seventh example embodiment, rotation and focus correction of the reticle are performed by manipulating the reticle stage, and rotation and focus correction of the substrate are performed by manipulating the substrate stage. Thus, using this scheme, errors are directly detected and corrected without having to execute complex correction calculations that are otherwise required when, for example, height displacement of the reticle is corrected by manipulating the substrate stage and vice versa.

In an eighth example embodiment, correction of reticle rotation and other displacements (correction (a)) are performed by moving the substrate stage 18 as actuated by the substrate-stage driver 25. This scheme allows the reticle-stage driver 17 to have a simple structure or be eliminated entirely. Corrections (b), (c), (d), and (e) can be implemented according to any of the example embodiments described above.

Figure 4:
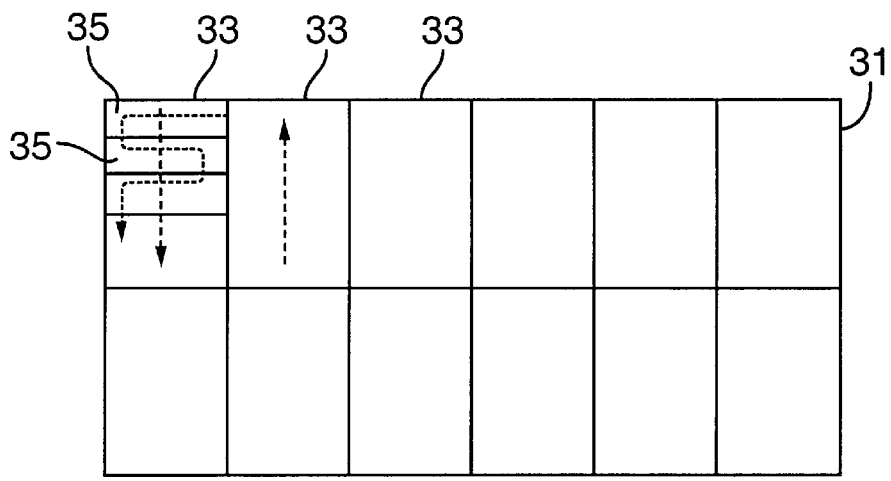
FIG. 4 is a plan view of a second exemplary arrangement of multiple fields within a chip die.
Figure 5:
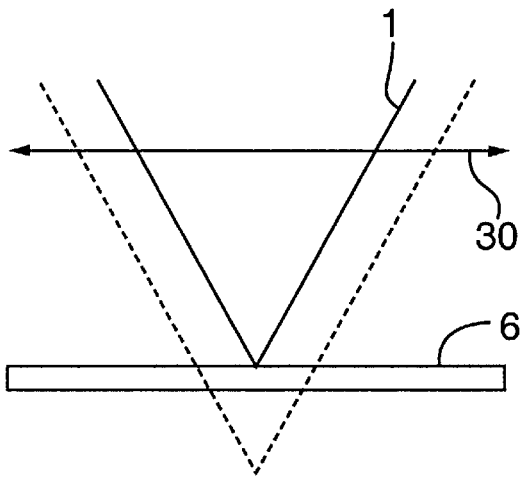
FIG. 5 is an elevational depiction of correcting image-focus displacement (defocus) in a conventional electron-beam projection exposure apparatus by changing the lens action of a lens upstream of the substrate.
Figure 6:
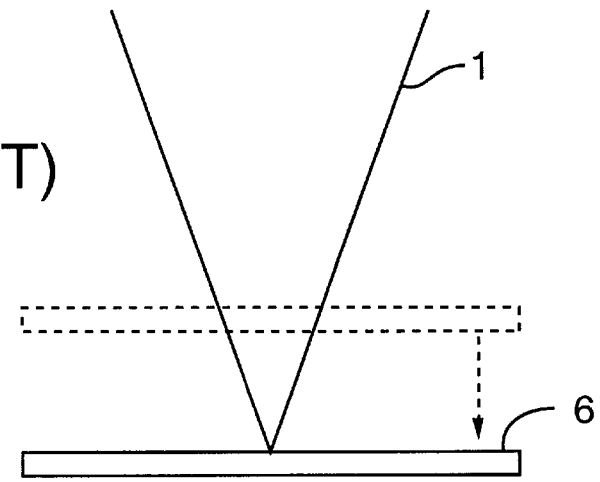
FIG. 6 is an elevational depiction of correcting image-focus displacement (defocus) in a conventional electron-beam projection-exposure apparatus by shifting the position of the substrate along the optical axis (i.e., changing the "height" of the substrate).

The ninth example embodiment is explained using FIG. 4 showing a chip field 31, stripes 33 of the chip field 31, and "slots" 35. In this embodiment, the chip field 31 to be exposed is divided into multiple stripes 33, and each stripe is subdivided into multiple slots 35 rather than subfields. Whereas, in other example embodiments, subfields are individually exposed one at a time using one "shot" per subfield, exposure of a slot according to the instant embodiment is performed by scanning the electron beam within the slot. In FIG. 4, the slots 35 are scanned by the electron beam in a raster manner (achieved by scanning the electron beam sequentially left and right in the figure while moving the stage sequentially up and down in the figure in a coordinated manner). When exposure of all slots 35 within a stripe 33 is completed, the adjacent stripe 33 is scanned in a raster manner in a reverse direction, as indicated by the arrow.

With such a scheme, corrections (a), (b), and (c) can be performed according to any of the example embodiments described above. For example, corrections (a), (b), and (c) all can be performed by manipulating one or both stages, or corrections (a) and (b) can be performed by manipulating one or both stages and correction (c) can be performed using the image-adjustment lens 8 (and deflector 7 as required). Whenever rapid responsiveness is not required, it is desirable to perform corrections for each slot by manipulating one or both stages. When rapid responsiveness is required, it is desirable to perform corrections for each slot using the image-correction lens 8. Whenever correction (c) is performed using the image-adjustment lens 8, it is desirable that the corrections for each slot also be performed using the image-adjustment lens 8.

In this example embodiment, the magnitude of correction is greatest for corrections involving substrate position, followed in order by corrections for each chip, corrections for each stripe, corrections for each slot, and corrections within each slot (the last correction having the smallest magnitude). The relative response speeds are in opposite order, being fastest for corrections within each slot, followed in order by corrections for each slot, corrections for each stripe, corrections for each chip, and corrections for each substrate (the last correction being the most rapid). In this embodiment, corrections for each substrate, chip, and stripe (for which the magnitudes of correction tend to be relatively great and the response speeds can be slow) can be performed using the stage-correction device. However, because situations may arise in which rotation and focal displacement of the image within the slot 35 must be dynamically corrected, and because correction of image rotation and focus inside each slot 35 typically requires a fast response, such correction is performed in this example embodiment using the image-adjustment lens 8 (and deflector 7 as required). Hence, corrections are made by selectively exploiting the advantages of making corrections using the stage-correction device.

If the chip field 31 is directly divided into slots 35, a procedure as described above can be used as when stripes 33 are used.

In the example embodiments described above, corrections are performed as required in each subfield or in each slot. However, such corrections are not necessarily required if the accuracy of the projection-exposure apparatus is sufficiently high for the intended application of the apparatus.

Whereas the foregoing embodiments were described in the context of an electron-beam projection-exposure apparatus, it will be understood that any of various other charged particle beams can alternatively be used, such as an ion beam.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. In a method for imprinting an image of a pattern, defined by a reticle mounted on a reticle stage, onto a substrate mounted on a substrate stage using a charged particle beam passing through the reticle, through a projection lens, and through an image-adjustment lens to the substrate, a method for correcting an imaging fault, comprising:

(a) projecting the pattern image onto the substrate;

(b) detecting a positioning error of a stage from a nominal position, the positioning error resulting in an imaging fault;

(c) determining from the detected stage-position error a correction to the imaging fault; and (d) if the determined correction requires an adjustment displacement having a magnitude at or above a preset threshold, then correcting the imaging fault by moving a stage, and if the determined correction requires an adjustment displacement having a magnitude below the preset threshold and requiring an adjustment speed that does not reduce throughput from a level that would otherwise be achieved if no imaging fault were detected, then correcting the imaging fault by adjusting the image-adjustment lens.

2. The method of claim 1, wherein the imaging fault is selected from the group consisting of an image-rotation error, a image lateral-displacement error, and an image-defocusing error of the pattern image as formed on the substrate.

3. The method of claim 1, wherein:

the substrate is sized sufficiently to be exposed with at least one chip field;

the correction determined in step (c) includes an adjustment of at least one of the substrate and a chip field; and in step (d), adjustments of the substrate and of the chip field are performed as required by moving a stage.

4. The method of claim 3, wherein:

the reticle pattern is divided on the reticle into multiple stripe fields; and the correction determined in step (c) includes an adjustment of at least one of the substrate, the chip field, and a stripe field.

5. The method of claim 4, wherein, in step (d), adjustments of the stripe field are performed as required by moving a stage.

6. The method of claim 4, wherein, in step (d), adjustments of the stripe field are performed by adjusting the image-adjustment lens.

7. The method of claim 1, wherein:

the reticle pattern is divided on the reticle into multiple stripe fields each divided into multiple subfields for individual exposure onto a chip field on the substrate;

the substrate is sized sufficiently to be exposed with at least one chip field;

the correction determined in step (c) includes an adjustment of at least one of the substrate and a chip field; and in step (d), adjustments of the substrate and of the chip field are performed as required by moving a stage.

8. The method of claim 7, wherein:

the correction determined in step (c) further includes an adjustment of at least one of image rotation and image focus; and in step (d), adjustments of the image rotation and image focus are performed, as required, independently of adjustments of the substrate and chip field.

9. The method of claim 8, wherein, in step (d), adjustments of the image rotation and image focus are performed as required by moving a stage.

10. The method of claim 9, wherein, in step (d), any residual correction of at least one of the substrate, the chip field, image rotation, and image focus is performed as required by adjusting the image-adjustment lens.

11. The method of claim 10, wherein:

the correction determined in step (c) further includes an adjustment of the reticle; and in step (d), adjustments of the reticle are performed as required by moving a stage.

12. The method of claim 8, wherein, in step (d), adjustments of the image rotation and image focus are performed as required by adjusting the image-adjustment lens.

13. The method of claim 12, wherein, in step (d), any residual correction of at least one of the substrate, the chip field, image rotation, and image focus is performed as required by adjusting the image-adjustment lens.

14. The method of claim 13, wherein:

the correction determined in step (c) further includes an adjustment of the reticle; and in step (d), adjustments of the reticle are performed as required by moving a stage.

15. The method of claim 1, wherein:

the reticle pattern is divided on the reticle into multiple stripe fields each divided into multiple subfields for individual exposure onto a chip field on the substrate;

the substrate is sized sufficiently to be exposed with at least one chip field;

the correction determined in step (c) includes an adjustment of at least one of the substrate, a chip field, and a stripe field; and in step (d), adjustments of the substrate, the chip field, and the stripe field are performed as required by moving a stage.

16. The method of claim 15, wherein:

the correction determined in step (c) further includes an adjustment of a subfield; and in step (d), adjustments of the subfield are performed as required by adjusting the image-adjustment lens.

17. The method of claim 1, wherein:

the reticle pattern is divided on the reticle into multiple stripe fields each divided into multiple subfields for individual exposure onto a chip field on the substrate;

the substrate is sized sufficiently to be exposed with at least one chip field;

the correction determined in step (c) includes an adjustment of at least one of the substrate, a chip field, and a stripe field; and in step (d), adjustments of the substrate and the chip field are performed as required by moving a stage, and adjustments of the stripe field are performed as required by adjusting the image-adjustment lens.

18. The method of claim 17, wherein:

the correction determined in step (c) includes an adjustment of a subfield; and in step (d), adjustments of the subfield are performed as required by adjusting the image-adjustment lens.

19. The method of claim 1, wherein the reticle pattern is divided on the reticle into multiple subfields for individual exposure onto a chip field on the substrate;

the substrate is sized sufficiently to be exposed with at least one chip field;

the correction determined in step (c) includes an adjustment of the substrate; and in step (d), adjustments of the substrate are performed as required by moving a stage.

20. The method of claim 19, wherein:

the correction determined in step (c) includes an adjustment of the chip field; and in step (d) adjustments of the chip field are performed as required by moving a stage.

21. The method of claim 20, wherein:

the correction determined in step (c) includes an adjustment of a subfield; and adjustments of the subfield are performed as required by adjusting the image-adjustment lens.

22. The method of claim 1, wherein:

the reticle pattern is divided on the reticle into multiple stripe fields each divided into multiple slot fields for individual exposure onto a chip field on the substrate;

the substrate is sized sufficiently to be exposed with multiple separate chip fields; and the correction determined in step (c) includes an adjustment of one or more of the substrate, the chip fields, the stripe fields, and the slot fields.

23. The method of claim 22, wherein, in step (d), adjustments of one or more of the substrate, the chip fields, the stripe fields, and the slot fields are performed as required by moving a stage.

24. The method of claim 22, wherein, in step (d), adjustments of one or more of the substrate, the chip fields, the stripe fields, and the slot fields are performed as required by adjusting the image-adjustment lens.

25. The method of claim 22, wherein, in step (d), adjustments of one or more of the substrate, the chip fields, and the stripe fields are performed as required by moving a stage, and adjustments of the slot fields are performed as required by adjusting the image-adjustment lens.

26. The method of claim 22, wherein, in step (d), adjustments of one or more of the substrate and the chip fields are performed as required by moving a stage, and adjustments of one or more of the stripe fields and the slot fields are performed as required by adjusting the image-adjustment lens.

27. The method of claim 1, wherein:
the reticle pattern is divided on the reticle into multiple slot fields for individual exposure onto a chip field on the substrate;
the substrate is sized sufficiently to be exposed with multiple separate chip fields; and
the correction determined in step (c) includes an adjustment of one or more of the substrate, the chip fields, and the slot fields.

28. The method of claim 27, wherein, in step (d), adjustments of one or more of the substrate, the chip fields, and the slot fields are performed as required by moving a stage.

29. The method of claim 27, wherein, in step (d), adjustments of one or more of the substrate and the chip fields are performed as required by moving a stage, and adjustments of the slot fields are made as required by adjusting the image-adjustment lens.

30. The method of claim 1, wherein:
the correction determined in step (c) includes an adjustment of at least one of rotation of the reticle stage, height of the reticle stage, rotation of the substrate stage, and height of the substrate stage; and
in step (d), adjustments of at least one of rotation of the reticle stage and height of the reticle stage are performed as required by moving the reticle stage, and adjustments of at least one of rotation of the substrate stage and height of the substrate stage are performed as required by moving the substrate stage.

31. The method of claim 30, wherein, in step (d), correction of any residual errors is performed as required by adjusting the image-adjustment lens.

32. The method of claim 1, wherein:
the correction determined in step (c) includes an adjustment of at least one of rotation of the reticle stage and height of the reticle stage; and
in step (d), adjustments of at least one of rotation of the reticle stage and height of the reticle stage are performed as required by moving the substrate stage.

33. The method of claim 32, wherein, in step (d), correction of any residual errors is performed as required by adjusting the image-adjustment lens.

* * * * *